United States Patent [19]
von Brömssen

[11] 4,009,442
[45] Feb. 22, 1977

[54] DEVICE WHICH AMONG A NUMBER OF RADIO SIGNALS SELECTS ONE SPECIALLY MARKED RADIO SIGNAL

[76] Inventor: Knut Thorkel von Brömssen, Ryaavagen 100, S-191 47 Sollentuna, Sweden

[22] Filed: May 12, 1975

[21] Appl. No.: 576,816

[52] U.S. Cl. .............................. 325/470; 325/55; 325/466

[51] Int. Cl.² .......................................... H04B 1/32

[58] Field of Search .......... 325/470, 466, 467, 468, 325/453, 457, 464, 55, 64; 343/177, 179, 205, 206

[56] References Cited
UNITED STATES PATENTS

| 2,641,757 | 6/1953 | Hoth et al. | 343/177 |
| 2,733,337 | 1/1956 | Mitchell et al. | 325/55 |
| 3,173,996 | 3/1965 | Rypinski, Jr. | 179/41 |
| 3,426,279 | 2/1969 | Berman | 325/21 |
| 3,447,087 | 5/1969 | Takezaki et al. | 325/422 |
| 3,482,166 | 12/1969 | Muilwijk | 325/341 |
| 3,535,636 | 10/1970 | Muizwijk | 325/25 |
| 3,631,497 | 12/1971 | Leonard | 343/179 |
| 3,832,636 | 8/1974 | Kubo | 325/25 |
| 3,840,811 | 10/1974 | Blouch | 325/55 |

OTHER PUBLICATIONS

Heathkit Assembly Manual–Digital F-M Stereo Tuner Model AJ1510 Copyright 1972 pp. 1,201,202,211,199,200,205.

Primary Examiner—Robert L. Griffin
Assistant Examiner—Marc E. Bookbinder
Attorney, Agent, or Firm—Pollock, Vande Sande & Priddy

[57] ABSTRACT

The present invention relates to a device for selecting a specially marked radio signal among a number of radio signals. The device includes receiving equipment for the radio signals, which is arranged to automatically scan the frequency band within which the radio signals appear. The scanning is made by a sweep generator, which is part of the receiving equipment. A special locking circuit for the sweep generator (time base circuit) is activated when a radio signal is found during the scanning period, and the locking circuit, when activated, affects the sweep generator so that the scanning is stopped at least for a predetermined short period, suitably controlled by the locking circuit. The radio signal referred to is sensed during the mentioned short period after which the sweep generator is initiated to continue its interrupted scanning, provided the sensed radio signal does not have the mentioned marking. If, on the contrary, the sensed radio signal has the mentioned marking, an identification circuit which is part of the receiving equipment indicates this during the mentioned short period at which the scanning is stopped and the selection is performed.

3 Claims, 9 Drawing Figures

DEVICE WHICH AMONG A NUMBER OF RADIO SIGNALS SELECTS ONE SPECIALLY MARKED RADIO SIGNAL

FIELD OF THE INVENTION

The invention is useful when one desires to lock a device on a certain radio signal having a frequency not known by the device, which radio signal appears within a frequency band scanned by the device. Mobile radio, mobile telephone and mobile seaching systems can be mentioned as examples of fields of application.

BACKGROUND

The present invention relates to a device which within a radio frequency band, selects from among a number of radio signals one radio signal which is marked in a special way, e.g. in the form of a low-frequency tone modulationg the carrier. The device includes known receiving equipment comprising a high-frequency unit for the reception of the radio signals, a local oscillator and connected thereto a time base circuit which when activated, controls the local oscillator by its output scanning voltage. The local oscillator is actuated by the mentioned output scanning voltage so that it will vary its output frequency within a predetermined frequency range. Furthermore, the receiving equipment comprises a mixer stage connected to the outputs of the high-frequency unit and the local oscillator; and intermediate-frequency stage connected to and following the mixer stage, the intermediate-frequency stage producing an amplified signal each time the varying output frequency from the local oscillator corresponds, in a prescribed way, to a radio signal; a discriminator connected to and following the intermediate-frequency stage and an identification circuit arranged to be activated during the sensing periods of the radio signals respectively and responsive to the mentioned special marking. The discriminator, in this connection, is of that type which on its first output gives a signal equivalent to the marking modulated on the carrier, and on a second output gives the so called discriminating signal which indicates the occurrence of the carrier. The discriminating signal is henceforth also called control signal.

OBJECTS OF THE PRESENT INVENTION

For instance, in mobile telephone systems it is essential that the scanning of the frequency band and the locking procedure to the current frequency frequence is performed quickly and automatically so a speech connection can be transmitted to another radio channel during the conversation if the quality of the used radio channel goes below a certain level.

One object of the present invention is to improve the device mentioned above in order to provide a rapid and purposeful scanning of the radio signals of the frequency band, and a selection of the radio signal with the mentioned marking.

SUMMARY OF THE INVENTION

According to the invention the device is equipped with a locking circuit for the sweep generator, the locking circuit being controlled by the control signal from the discriminator and during operation it activates the sweep generator so that its output scanning voltage to the local oscillator is essentially kept constant during a comparatively short period. During this short period the receiving equipment senses the radio signal and if this does not have the special marking the locking circuit ceases to actuate the sweep generator so that it can then proceed with its interrupted sweeping until a new radio signal is found, etc. If, on the contrary, the radio signal contains the special marking, the identification circuit reacts to this whereupon the sweep generator is actuated in such a way that the scanning is stopped.

In a preferred embodiment the mentioned locking circuit interacts with a receiving equipment arranged for automatic holding on the positioned radio signal, so called automatic frequency control (AFC). Such a control is in itself well known and is characterized by its ability to keep the device on the middle frequency of the radio signal irrespective of drifting tendencies of the device. The control works with a feed-back loop which in addition to the mixer stage, the intermediate-frequency stage, the discriminator, the time base circuit and the local oscillator, comprises a holding circuit to be activated from the locking circuit for the sweep generator, the holding circuit being activated at least during the earlier mentioned short period and which at its operation makes the mentioned control active. The activation of the holding circuit in connection to the scanning is suitably made by means of a fast charging circuit, which during the short predetermined time makes the feed-back loop work with a comparatively short time constant enabling the equipment to tune rapidly to the proper frequency. The locking circuit switches off the holding circuit if the sensed radio signal does not have the marking. If, on the contrary, the radio signal does have said marking, the activation of the holding circuit is taken over by the identification circuit. In this later case the identification circuit also takes over the holding of the sweep generator, while the locking circuit at its disactivation after the predetermined short period switches off the fast charging circuit from the holding circuit, which after that operates with a longer time constant.

BRIEF DESCRIPTION OF THE DRAWINGS

In order that the invention may be readily understood one embodiment of the present device in accordance therewith will now be described, by way of example, with reference to the accompanying drawing where FIG. 1 in the form of a block diagram shows the device;

FIG. 5b in the form of a diagram shows in detail a single sweep of the scanning voltage according to FIG. 5a;

FIG. 6 in the form of a block diagram shows a further component of the device according to FIG. 1.

DESCRIPTION OF THE PREFERRED EMBODIMENT

Figure 1:
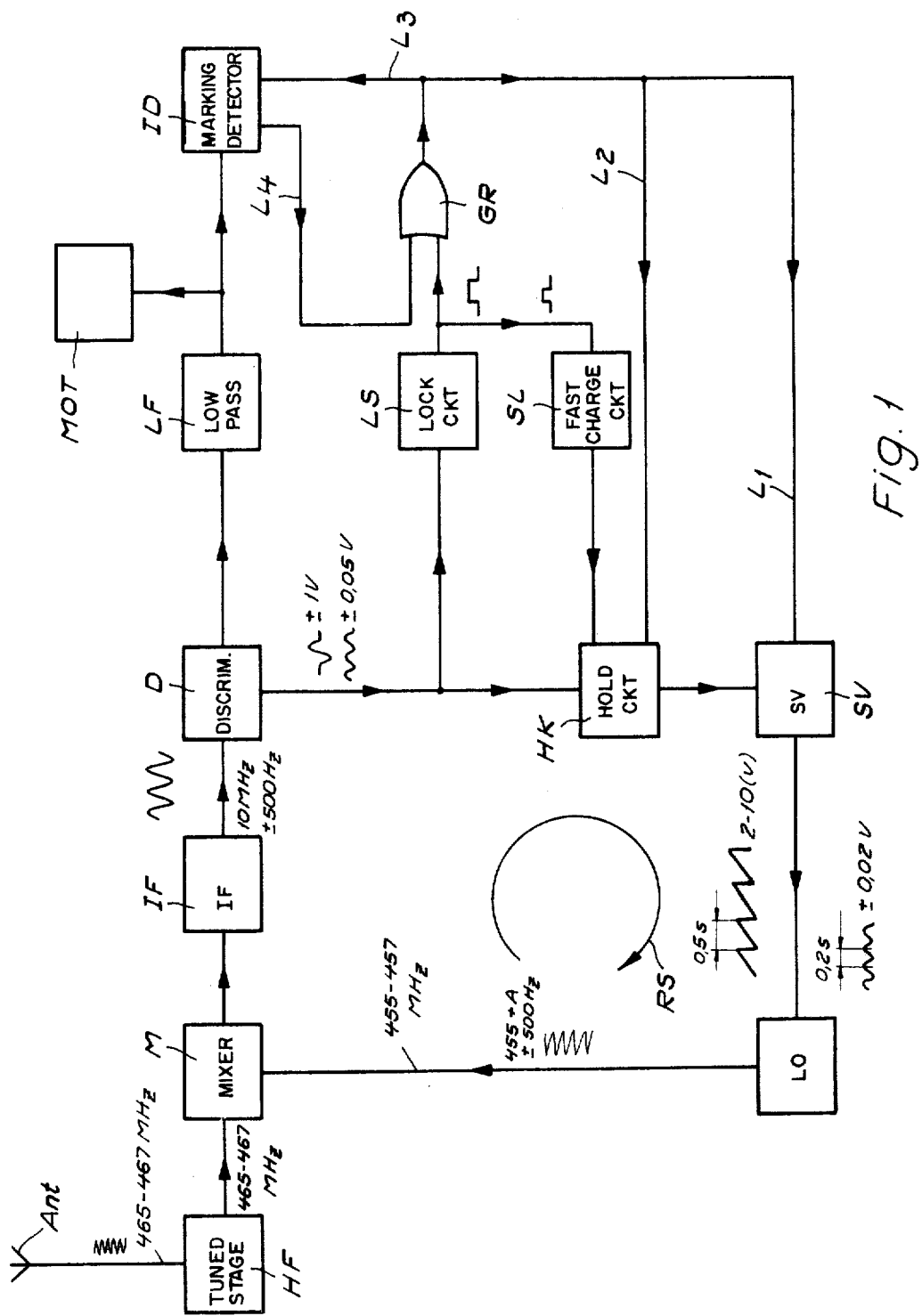

In the drawings, elements which corresponds to each other have been given the same reference numbers.

In FIG. 1 a receiving equipment is shown. A receiving antenna is designated Ant and a high-frequency unit designated HF. The equipment also comprises a local oscillator LO, a mixer stage M connected to the outputs of the high-frequency stage and the local oscillator, and with the output of the mixer stage being connected to an intermediate-frequency amplifier IF. To the output of the intermediate-frequency stage a discriminator D is connected, and the local oscillator is controlled by a sweep generator SV. The mentioned units, taken by themselves, may be designed in a well-known way and will therefore not here be dealt with in detail.

The high-frequency stage is tuned to receive frequencies within a predetermined band, e.g. the band between 465 and 467 MHz. The local oscillator is operated from the sweep generator in such a way that, dependent on the control, it can vary the frequency of its output signal between 455 and 457 MHz, which in more general terms can be expressed as 455 + A MHz, where A is 2 MHz. The intermediate-frequency amplifier IF provides a 10 MHz signal each time the difference between the received carrier frequency and the frequency on the output of the local oscillator is 10 MHz. The discriminator is then arranged in such a way that a low-frequency tone which has been modulated on the received radio signal and thus represents the special marking of the radio signal, is separated and presented on a first output of the discriminator. The discriminator is also arranged to deliver a so called discriminating signal on a second output, the signal being used as a control signal in the receiving equipment according to the following.

To the above-mentioned first output of the discriminator then is connected to a low-frequency amplifier LF in which the low-frequency signal is amplified. The output of the low-frequency amplifier is, in turn, connected to an identification circuit ID which is responsive to the low-frequency tone of the special marking. To the output of the low-frequency amplifier LF is also connected a receiver Mot for audio-signals which however has no direct connection to the invention.

The receiving equipment shown in FIG. 1 is also arranged for so-called automatic frequency control. i.e. the equipment is automatically kept to one radio signal selected in the scanning cycle by the equipment. For this purpose, the device comprises a holding circuit HK which, in its activated condition is a part of designated by arrow RS which is effective to feed-back loop, neutralize driving tendencies in the device and keeping it on the middle frequency of the current radio signal. The following magnitudes are typical for the above mentioned signal voltages. The discriminator output is of a magnitude of ± 1 V, the adjustment voltage between the sweep generator and the holding circuit ± 0.05 V, and the adjustment voltage between the sweep generator and the local oscillator ± 0.02 V (period time 0.2 s). Due to the variation of the adjustment voltage, both the signal from the local oscillator and the intermediate-frequency signal will have their frequencies varied by ± 500 Hz in relation to their nominal values. The scanning voltage is varied between 2–10 V, and the scanning period is in the presented case 0.5 s.

The sweep generator SV is allotted a special locking circuit LS arranged to actuate the sweep generator as soon as the receiving equipment during its scanning period finds a radio signal. The locking circuit is made to actuate by means of the control signal from the second output of the descriminator, the control signal by its negative back-flank trigging a monostable circuit (flip-flop), the latter being part of the locking circuit. The locking circuit actuates the sweep generator via, among other things, an OR-gate GR and the conductor designated L1 in FIG. 1. When activated, the locking circuit actuates the sweep generator SV in such a way that the output voltage of the sweep generator is kept constant, i.e. the scanning of the equipment is stopped. The locking circuit also actuates the holding circuit via a conductor L2, activating the feed-back loop, which implies that the equipment rapidly tries to make a precise tuning to the middle frequency of the sensed radio signal.

The activation of the locking circuit also implies an activation of the identification circuit ID via a conductor L3, as well as an activation of a fast charging circuit SL, which is connected to the holding circuit HK. The fast charging circuit enables the sweep capacitor of the sweep generator to charge or discharge rapidly so that in this phase the feed-back loop has a short time constant so that the build-up process to the mid-frequency can be obtained extremely rapidly.

The equipment in this condition is rapidly tuned to the radio signal at issue, then senses whether the radio signal is provided with the marking tone, to which the activated identification circuit is responsive. If the sensed radio signal is not provided with the marking tone referred to, the locking circuit LS will cease to influence the sweep generator as the monostable circuit of the locking circuit after its activation period switches back to its original position. After that the sweep generator can continue with its sweeping process, i.e. the scanning proceeds. The disactivation of the locking circuit, i.e. the switching of the monostable circuit back to its original position also causes the identification- and holding circuits to be blocked, as well as the fast charging circuit and the feed-back loop is opened. The identification circuit is blocked during the scanning due to the fact that the noise signals from the discriminator otherwise might influence the identification circuit and by that endanger the criteria for identification. Even the holding circuit must be blocked during the scanning because otherwise the equipment's received noise-signal would fluctuate around the zero-level of the discrimator signal output, causing the output scanning voltage to be influenced in a way that the scanning would be jagged.

In case the sensed radio signal contains the marking tone, this is indicated by the identification circuit, whereupon the identification circuit via a conductor L4 and the OR-gate GR takes over its own activation, the activation of the holding circuit and the sweep generator. Also in this case the locking circuit is disactivated when the activated period of the monostable circuit is finished, the locking circuit at its disactivation switching off the fast charging circuit SL, making the feed-back after that work with a comparatively long time constant. Such a long time constant is necessary because the feed-back loop has to work with a certain inertia since the equipment has been locked to a carrier marked with the mentioned tone. Otherwise rapid changes due to disturbances would be produced in the audio-signal receiver Mot.

Figure 2:
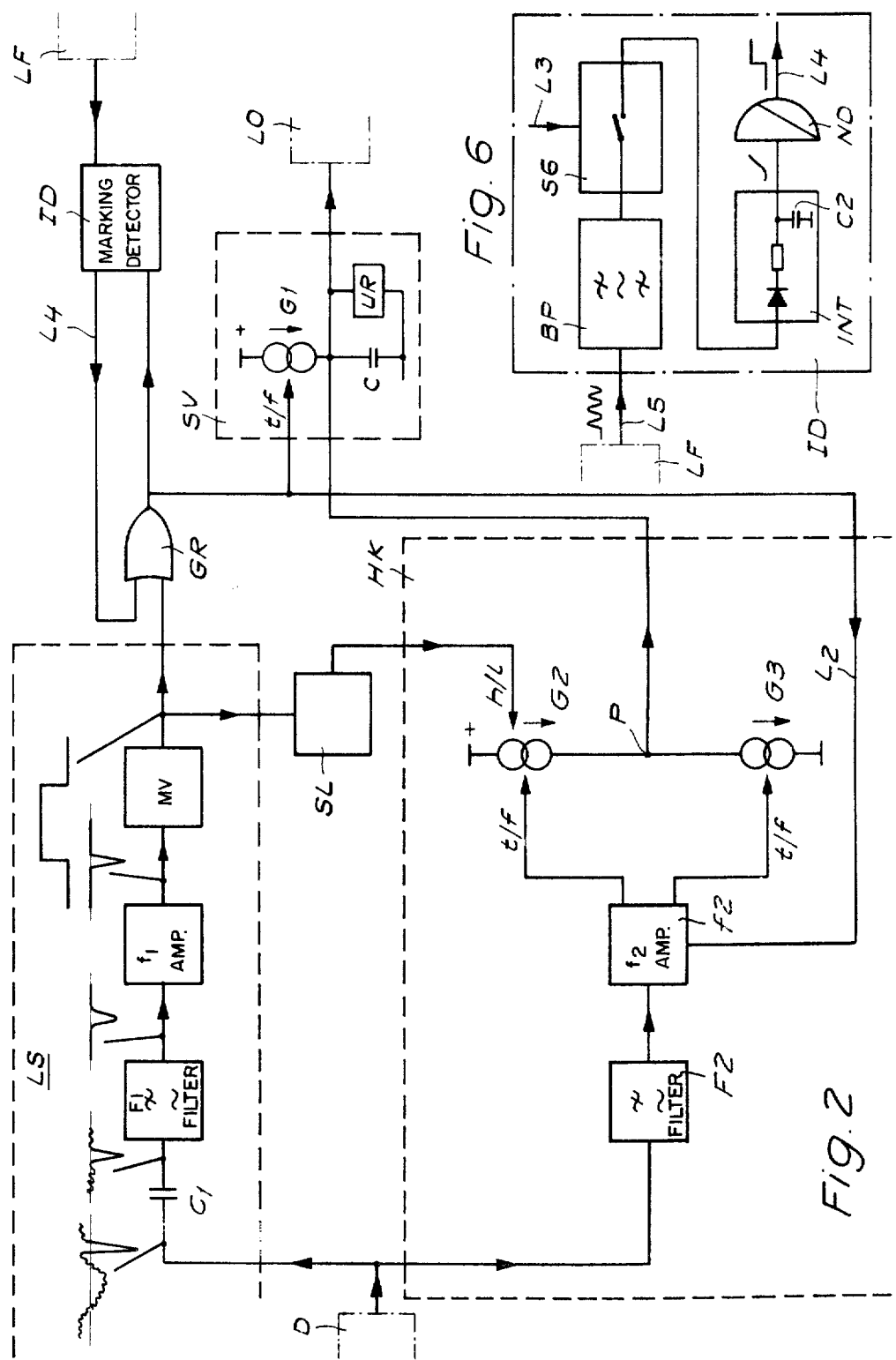
FIG. 2 in the form of a block diagram shows particulars of the device according to FIG. 1.

FIG. 2 presents in more in detail the design of the locking circuit LS, the holding circuit HK and the time base circuit SV. The locking circuit includes signal conditioning circuits for the incoming pilot signal from the discriminator, the signal conditioning circuits comprising a capacitor C1 which eliminates the influence from DC-deviation (direct current deviation) and slow distrubances, as well as a low-pass filter F1 diminishing risks of disturbances from higher frequencies. The locking circuit also includes a differential amplifier f1 and the mentioned monostable circuit MV. The monostable circuit produces a pulse with the length of $\Delta t$, which via the OR-gate actuates the scanning circuit in such a way that scanning is stopped during the mentioned time $\Delta t$. The mentioned time has, in the embodiment referred to, a period of 25–70 ms, but may of course be selected according to the requirements of the application in question. The scanning period of the time base circuit is in the selected embodiment 0.2 – 1.0 s.

Also the holding circuit is equipped with a low-pass filter F2 for the incoming control signal from the discriminator and a differential amplifier f2 which is actuated by the output signal of the monostable circuit. The holding circuit is equipped with two current generators G2 and G3, controlled respectively from the two outputs of the differential amplifier f2. The juction P, between the current generators G2 and G3, is connected to the time base circuit SV, which contains a current generator G1 activated and de-activated respectively by the signal of the monostable circuit. The time base circuit's capacitor C is charged the current generator G1.

The connection- and disconnection functions of the current generator is marked $t/f$ in FIG. 2. The capacitor C of the time base circuit interacts with a discharging circuit UR which discharges the mentioned capacitor as soon as it has been charged to a certain higher level. By means of the present design the capacitor C can be allotted that charging voltage which is equivalent to the desired frequency of the output of the local oscillator. This charging is made during each phase of locking by the locking circuit with the current generator G1 disconnected. If the charging voltage has a tendency to be too low due to leakage, the capacitor is charged by the current generator G2 and if, on the contrary, the charging voltage is too high the capacitor is discharged via the current generator G3. The on- and off-functions of the current generators G2 and G3 are indicated $t/f$, whereas $h/l$ in FIG. 2 indicates high/low (the fast and the slow charging, respectively).

Figure 3:
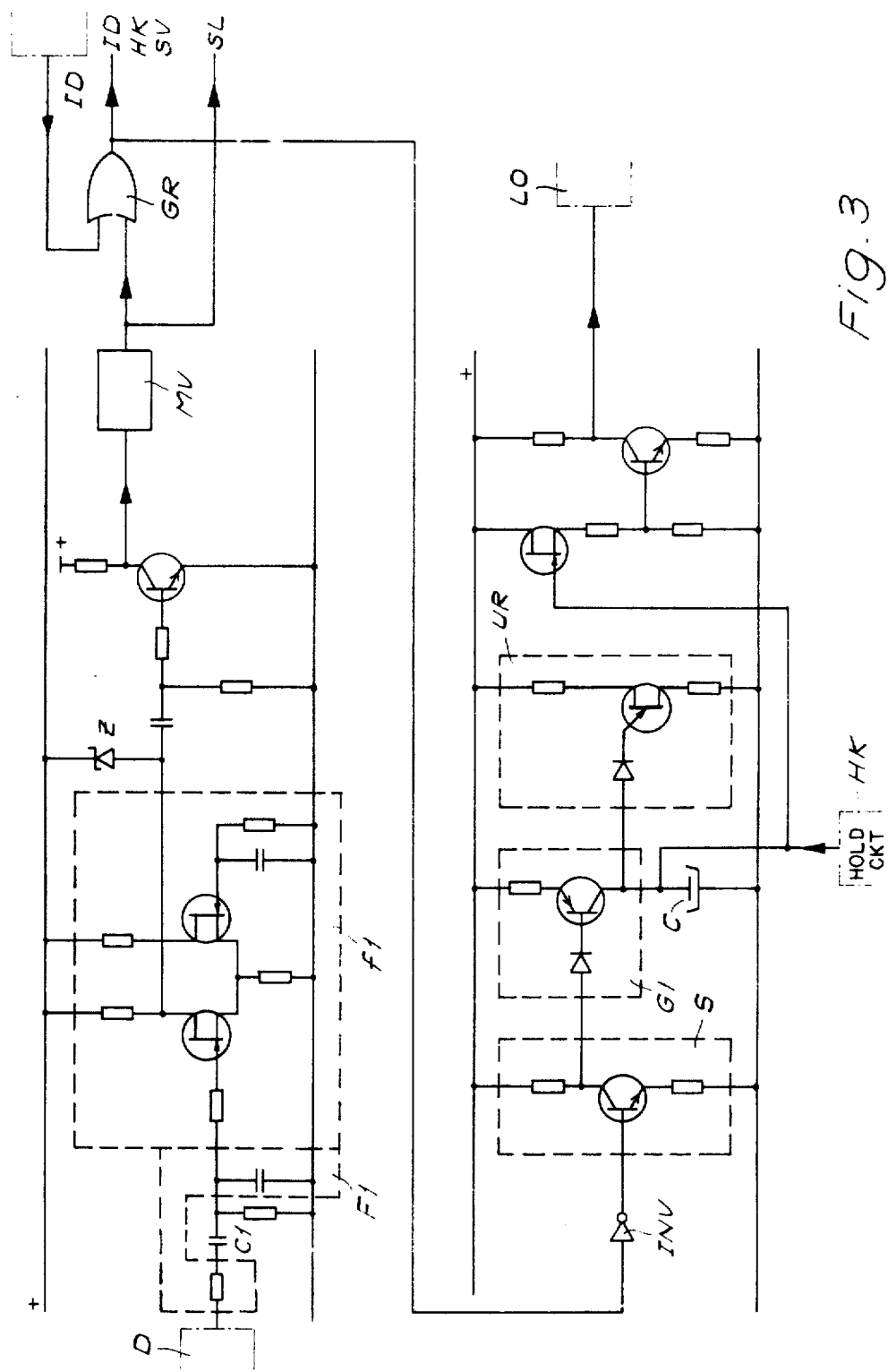
FIG. 3 in the form of a circuit diagram shows first parts of the particulars according to FIG. 2.

FIG. 3 presents in detail an example of the components referred to in the locking- and time base circuits. The design of the differential amplifier f1 is in itself well-known which is also the case with the monostable circuit MV (flip-flop), the details of which, however, are not shown in FIG. 3 as they can consist of a conventional an in itself well-known monostable circuit.

Between the amplifier f1 and the monostable circuit MV conditioning circuits are connected partly in the form of a zener diode Z, passing only negative pulses from the discriminator to the monostable circuit MV, partly in the form of an amplifying stage providing proper driving voltage to the monostable circuit. The time base circuit is equipped with an inverter INV and a switch circuit S, the latter used for on- and off-switching of the current generator G1. The discharging circuit UR includes a connected unijunction transistor, the connection of which in itself being well-known. Between the output of the time base circuit and the input of the local oscillator there is one more conditioning circuit.

Figure 4:
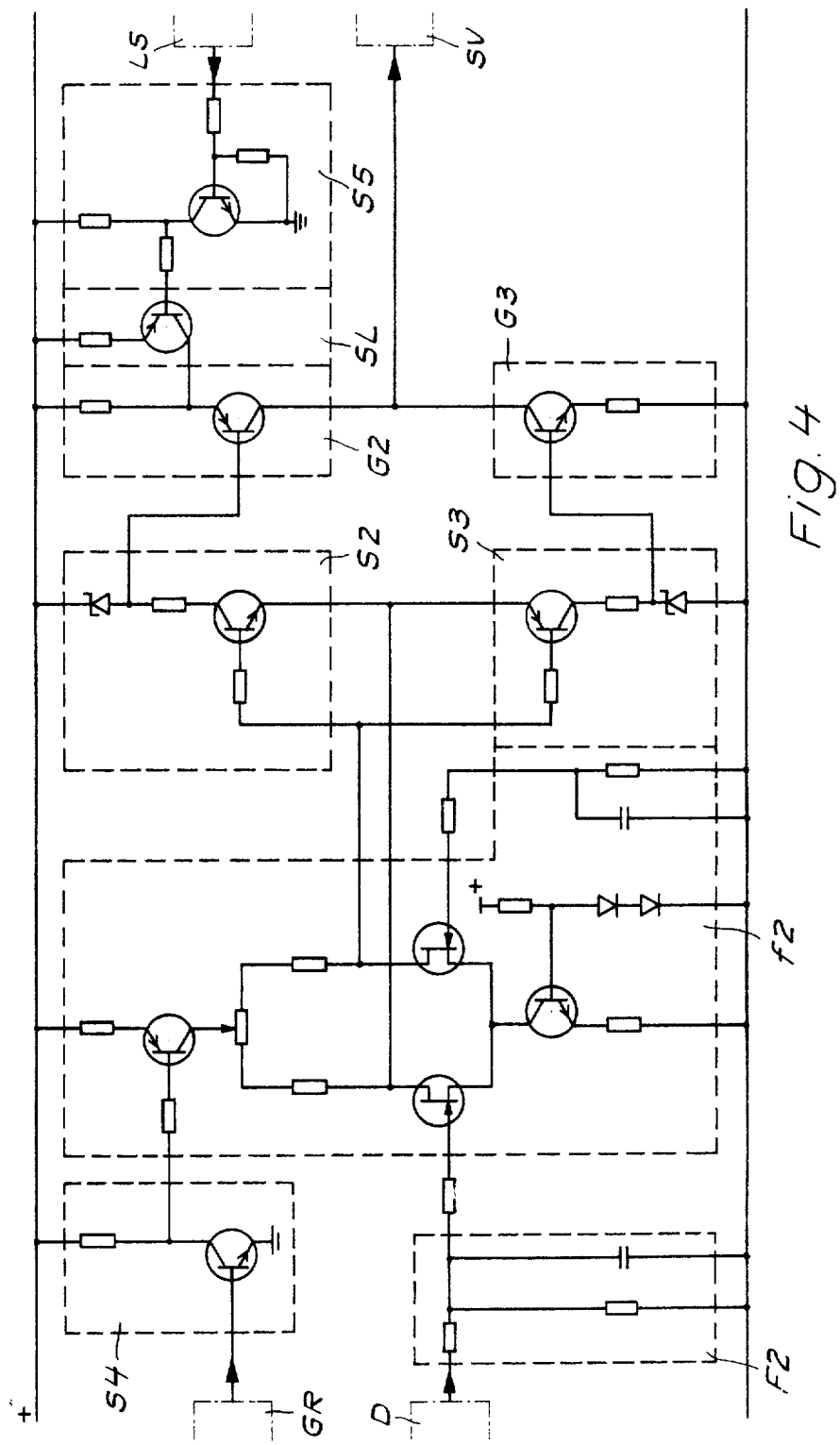
FIG. 4 in the form of a circuit diagram shows other parts of the particulars according to FIG. 2.

FIG. 4 shows an example of a design of the holding and fast charging circuits in detail. The holding circuit includes the switching circuits S2 and S3 controlling the on- and off-switching of the current generators G2 and G3, due to directions from the differential amplifier f2. The acitvation of the holding circuit is made via a switch circuit S4 which keeps the holding circuit blocked during the scanning. The on- and off-switching of the fast charging circuit is arranged by means of a switching circuit S5, directed from the monostable circuit MV.

FIG. 6 shows in the form of a circuit diagram an example of the identification circuit ID. By conductor L5 the low-frequency signal from the low-frequency stage is brought to the band pass filter BP. A switch S6 keeps an integrator INT disconnected during the scanning. If locking is made to a radio signal modulated with the desired marking tone, this tone will pass the band pass filter and the switch, and be brought to the integrator. The voltage over the integration capacitor C2 then increases until a level detector ND switches, and on its output delivers a high voltage which via the conductor L4 is to take over the locking of the holding circuit and the activation of the switch S6 in the identification circuit.

OPERATION

Figure 5A:
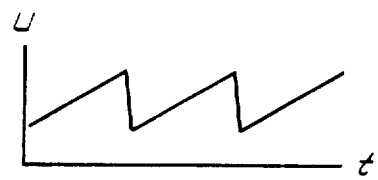
FIG. 5a in the form of a diagram shows the output scanning voltage of a sweep generator used in the device.
Figure 5B:
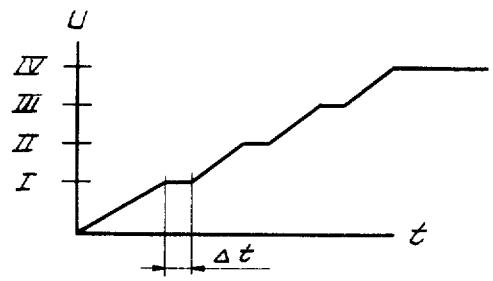

The operations of the equipment presented above are described more precisely by means of the time diagrams according to FIG. 5a – 5d; the vertical axes indicating the voltage U and the horizontal axes the time $t$. The time base circuit SV is assumed to be activated feeding the local oscillator LO with a scanning voltage according to FIG. 5a until a radio signal with a low-frequency marking tone has been identified. According to what has been earlier mentioned to local oscillator sweeps between 455 and 457 MHz so that the band 465–467 of the received signal in the high-frequency stage can be scanned continuously via the intermediate-frequency stage MF which only admits difference frequencies of 10 MHz. Each time a radio signal is found within the scanned band the device, as has been earlier mentioned, is to be locked to the typical frequency during a predetermined period sufficient for sensing whether the radio signal is provided with the mentioned marking. After the sensing time the sweeping is either to proceed if there is no marking, or the locked position is to be kept if there is a marking. In FIG. 5b this is shown by means of a detailed part of a single envelope according to FIG. 5a. At I a radio signal within the band has been found and sensed during the time $\Delta t$, which has also occurred at II and III. At IV the radio signal at issue is provided with a marking to which the equipment is responsive, and consequently the device is locked to the radio signal after the sensing.

During the sweep between II and III, for example, in FIG. 5b, the discriminator will sense only noise, which is the case with the low-frequency amplifier as well. During the sweep procedure the locking circuit is disactivated, the identification and holding circuits are blocked, and the fast charging circuit and the feedback loop disactivated.

Figure 5C:
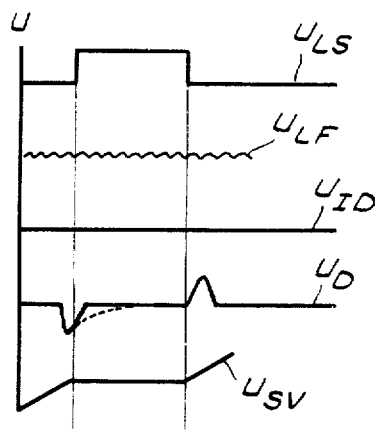
FIG. 5c in the form of a diagram shows signals in the different units of the device during a first cycle of operation.

When, according to FIG. 5b, a radio signal is found, e.g. at III, the discriminator is actuated via the mixer stage and intermediate-frequency stage, causing the discriminator to emit a signal $U_D$ to the locking circuit according to FIG. 5c, which shows the output signals from the LS-, LF-, ID-, D- and SV-units. Accordingly, the monostable circuit of the locking circuit is trigged and emits a signal $U_{LS}$ shown in FIG. 5c. Assuming that the detected radio signal lacks the special marking, the signal $U_{LF}$ from the low-frequency amplifier will be of a quality to which the identification circuit is not resonant, the signal $U_{ID}$ of the identification circuit accordingly being zero. When the monostable circuit returns to its initial position, the locking of the sweep generator ceases and the sweeping proceeds towards IV like the sweeping cycle between II and III. At the end of the locking a positive peak is created in the signal $U_D$ of the discriminator, the following circuits, however, are not responsive to this peak signal.

Figure 5D:
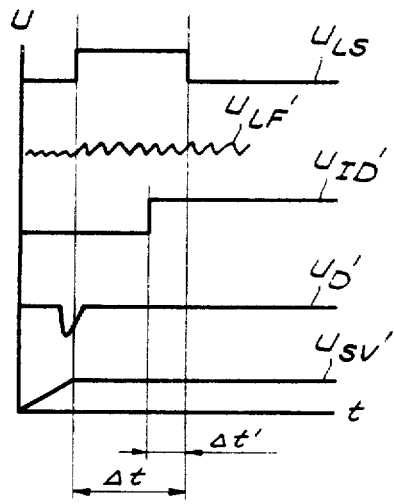
FIG. 5d in the form of a diagram shows signals in the same units as in FIG. 5c during a second cycle of operation.

When, in the sweeping proceeding, the radio signal at IV is found, an analogous sensing as in the above mentioned context is executed, and because this sensed radio signal is assumed to have a marking in the form of a low-frequency tone modulated on a carrier, output signals $U_{LF}'$ and $U_{ID}'$ are obtained from the low-frequency amplifier and the identification circuit respectively, according to FIG. 5d. It is to be noted that the identification circuit must be fast at emitting its output signal so it can take over the locking of the sweep generator before the monostable circuit returns to its initial position. The predetermined time (= the activation time of the monostable circuit) and the identification circuit must be so dimensioned that the safety margin $\Delta t'$ is secured.

The feed-back loop works as a known regulating circuit. If the scanning voltage deviates, e.g. due to a leakage in the sweep capacitor, the local oscillator frequency is changed, resulting in a change of the intermediate-frequency and a drift from the zero-voltage of the discriminator signal. Through the holding circuit the scanning voltage is then changed so a balance is re-established, i.e. the discriminator voltage reaches a zero-level. The fast charging circuit allows the discriminator signal $U_D$, shown in full line in FIG. 5c, can rapidly reach its zero-position. The form of the discriminator signal when the fast charging circuit is lacking or out of order is shown by a dashed line in FIG. 5c.

The device is kept locked on the frequency at issue until cleared by the identification circuit from external circuits not shown.

The invention is not limited to the embodiment illustrated above, which is only an example, and may be subjected to modifications within the scope of the following claims.

What is claimed is:
1. Apparatus for scanning within a radio frequency band and for selecting one radio signal from a possible number of radio signals which selected radio frequency signal includes a special marking, comprising:
    a. first means for receiving a radio frequency signal;
    b. local oscillator means;
    c. a time-base circuit for controlling the local oscillator by an output scanning voltage for causing the local oscillator to vary its output frequency within a predetermined frequency band in accordance with the variations in said output scanning voltage;
    d. a mixing stage connected to the outputs of said first means and to the local oscillator;
    e. an intermediate-frequency amplifier connected to the output of the mixer stage, said intermediate-frequency amplifier delivering an amplified signal each time the varying output frequency of the local oscillator corresponds to a received radio signal;
    f. a discriminator, connected to the output of the intermediate-frequency amplifier, providing a control signal depending upon the amplified signal;
    g. an identification circuit responsive to an output of said discriminator and activated during the sensing of radio signals for detecting said marking;
    h. a locking circuit connected between the discriminator and said time-base circuit, said locking circuit responsive to said control signal during a predetermined short period for inhibiting the time-base circuit to thereby maintain its output scanning voltage essentially constant so as to stop scanning during said predetermined short period,
    wherein the locking circuit includes a mono-stable circuit responsive to said control signal, the pulse-time of the mono-stable circuit defining said predetermined short period.

2. The apparatus of claim 1 wherein the locking circuit responds to the control signal to enable the identification circuit during said predetermined short period.

3. Apparatus of claim 1 including a holding circuit connected between the discriminator and the time-base circuit; said holding circuit, the local oscillator, the mixer stage, the intermediate-frequency amplifier and the discriminator comprising a feed-back loop operative when a radio signal with said marking has been identified;
    a fast-charging circuit connected between the output of the locking circuit and the holding circuit operated by the locking circuit, said fast-charging circuit reducing the time constant of said feed-back loop in the presence of said control signal by connecting a current generator to the holding circuit.

* * * * *